(12) United States Patent
Motonaga

(10) Patent No.: US 10,871,456 B2
(45) Date of Patent: Dec. 22, 2020

(54) SEMICONDUCTOR INSPECTION SYSTEM AND SEMICONDUCTOR INSPECTION APPARATUS

(71) Applicants: Kabushiki Kaisha Toshiba, Tokyo (JP); Toshiba Electronic Devices & Storage Corporation, Tokyo (JP)

(72) Inventor: Ikuo Motonaga, Ibo Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/562,502

(22) Filed: Sep. 6, 2019

(65) Prior Publication Data

US 2020/0256808 A1 Aug. 13, 2020

(30) Foreign Application Priority Data

Feb. 7, 2019 (JP) ................................ 2019-020417

(51) Int. Cl.
*G01N 21/956* (2006.01)
*H01L 23/02* (2006.01)

(52) U.S. Cl.
CPC ........... *G01N 21/956* (2013.01); *H01L 23/02* (2013.01)

(58) Field of Classification Search
CPC .................. G01N 21/956; G01N 2021/95661
See application file for complete search history.

(56) References Cited

U.S. PATENT DOCUMENTS

| | | | | |
|---|---|---|---|---|
| 5,208,463 A | * | 5/1993 | Honma | G01N 21/95684 250/559.34 |
| 5,212,390 A | * | 5/1993 | LeBeau | G01R 31/308 250/559.08 |
| 5,309,223 A | * | 5/1994 | Konicek | H05K 13/0813 356/621 |
| 5,452,080 A | * | 9/1995 | Tomiya | H05K 13/0813 356/237.1 |
| 5,528,371 A | * | 6/1996 | Sato | G01N 21/88 348/126 |

(Continued)

FOREIGN PATENT DOCUMENTS

EP 1139090 A2 10/2001
JP H04-352079 A 12/1992
(Continued)

*Primary Examiner* — Steven Whitesell Gordon
(74) *Attorney, Agent, or Firm* — White & Case LLP

(57) ABSTRACT

A semiconductor inspection system according to an embodiment includes first imaging unit capturing an image of a first lead of a semiconductor package from a first direction perpendicular to an upper surface, the semiconductor package including a sealing portion and the first lead, the sealing portion having the upper surface, the first lead extending sideward from the sealing portion; first calculation unit calculating a front length of the first lead from the image captured by the first imaging unit; second imaging unit capturing an image of the first lead from a second direction inclined to the upper surface; second calculation unit calculating an oblique length of the first lead from the image captured by the second imaging unit; and third calculation unit calculating an amount of floating of the first lead from a reference plane parallel to the upper surface, using the front length and the oblique length.

7 Claims, 10 Drawing Sheets

(56) References Cited

U.S. PATENT DOCUMENTS

| | | | | |
|---|---|---|---|---|
| 5,909,285 | A * | 6/1999 | Beaty | G01N 21/88 356/394 |
| 5,910,844 | A * | 6/1999 | Phillips | H04N 7/181 356/614 |
| 5,995,220 | A * | 11/1999 | Suzuki | G01N 21/95684 348/126 |
| 6,055,055 | A * | 4/2000 | Toh | G01N 21/88 250/559.46 |
| 6,118,538 | A * | 9/2000 | Haugan | H05K 13/0812 356/623 |
| 6,242,756 | B1 * | 6/2001 | Toh | G01N 21/95684 250/559.34 |
| 6,243,164 | B1 * | 6/2001 | Baldwin | G01N 21/95684 356/237.1 |
| 6,292,261 | B1 * | 9/2001 | Fishbaine | H05K 13/0812 356/623 |
| 6,307,210 | B1 * | 10/2001 | Suzuki | G01N 21/88 250/559.08 |
| 6,567,161 | B1 * | 5/2003 | Lee | H05K 13/0813 356/237.1 |
| 6,683,682 | B1 * | 1/2004 | Suzuki | G01N 21/95684 348/126 |
| 2003/0174318 | A1 * | 9/2003 | Quist | G01N 21/8806 356/237.1 |

FOREIGN PATENT DOCUMENTS

| | | |
|---|---|---|
| JP | H05-172755 A | 7/1993 |
| JP | H05-340733 A | 12/1993 |
| JP | H06-222012 A | 8/1994 |
| JP | H07-81849 B2 | 9/1995 |
| JP | H09-178453 A | 7/1997 |
| JP | 2001-304836 A | 10/2001 |
| JP | 2001-336919 A | 12/2001 |
| JP | 3181435 U | 2/2013 |

* cited by examiner

SEMICONDUCTOR INSPECTION SYSTEM AND SEMICONDUCTOR INSPECTION APPARATUS

CROSS-REFERENCE TO RELATED APPLICATION

This application is based upon and claims the benefit of priority from Japanese Patent Application No. 2019-020417, filed on Feb. 7, 2019, the entire contents of which are incorporated herein by reference.

FIELD

Embodiments described herein relate generally to a semiconductor inspection system and a semiconductor inspection apparatus.

BACKGROUND

In a case in which a lead of a semiconductor package floats from the original position, there is a problem that a connection failure occurs when the semiconductor package is mounted on, for example, a printed circuit board. Therefore, an inspection system that accurately measures the amount of floating of the lead is required in the appearance inspection of the semiconductor package.

DETAILED DESCRIPTION

Figure 1:
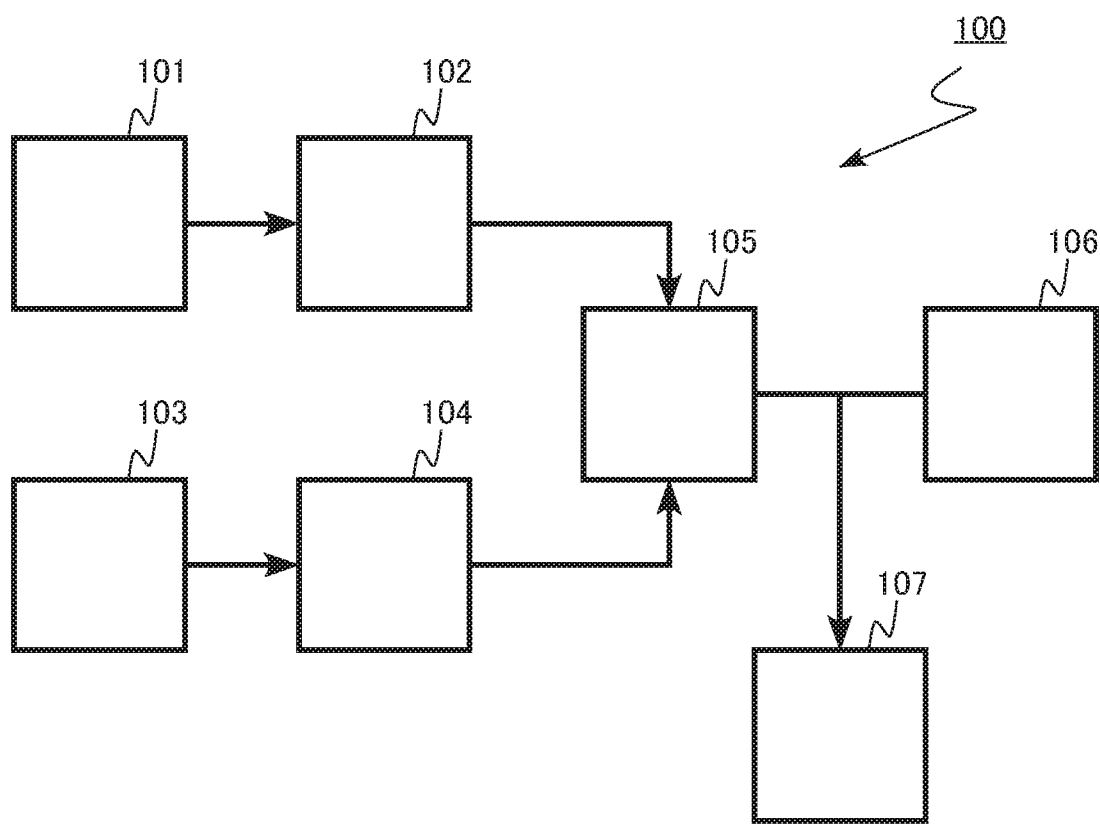
FIG. 1 is a block diagram illustrating a semiconductor inspection system according to an embodiment.

In the specification, the same or similar members are denoted by the same reference numerals and the description thereof will not be repeated.

A semiconductor inspection system according to an embodiment includes a first imaging unit capturing an image of a first lead of a semiconductor package from a first direction perpendicular to an upper surface and a lower surface, the semiconductor package including a sealing portion and the first lead, the sealing portion sealing a semiconductor chip, the sealing portion having the upper surface, the lower surface, a first side surface, and a second side surface opposite to the first side surface, the first lead extending sideward from the first side surface of the sealing portion; a first calculation unit calculating a front length of the first lead from the image captured by the first imaging unit; a second imaging unit capturing an image of the first lead from a second direction inclined with respect to the upper surface and the lower surface; a second calculation unit calculating an oblique length of the first lead from the image captured by the second imaging unit; and a third calculation unit calculating an amount of floating of the first lead from a reference plane parallel to the upper surface and the lower surface, using the front length and the oblique length.

In addition, according to an embodiment, there is provided a semiconductor inspection apparatus for inspecting a semiconductor package including a sealing portion, a first lead, and a second lead, the sealing portion sealing a semiconductor chip, the sealing portion having an upper surface, a lower surface, a first side surface, and a second side surface opposite to the first side surface, the first lead extending sideward from the first side surface of the sealing portion, the second lead extending sideward from the second side surface, the apparatus includes a first light source provided on an upper surface side and a first side surface side of the semiconductor package; a second light source provided on the upper surface side and a second side surface side of the semiconductor package; a first mirror provided on a lower surface side and the second side surface side of the semiconductor package, the first mirror reflecting a silhouette image of the first lead illuminated by the first light source; a second mirror provided on the lower surface side and the first side surface side of the semiconductor package, the second mirror reflecting a silhouette image of the second lead illuminated by the second light source; and a camera provided on the lower surface side of the semiconductor package, the camera being capable of capturing the silhouette image of the first lead and the silhouette image of the second lead at the same time.

The semiconductor inspection apparatus and the semiconductor inspection system according to the embodiments are used to inspect the appearance of the semiconductor package, particularly, to inspect the amount of floating of the semiconductor package.

FIG. 1 is a block diagram illustrating a semiconductor inspection system according to an embodiment.

A semiconductor inspection system 100 according to the embodiment includes a first imaging unit 101, a first calculation unit 102, a second imaging unit 103 (semiconductor inspection apparatus), a second calculation unit 104, a third calculation unit 105, a storage unit 106, and a determination unit 107. The first imaging unit 101, the first calculation unit 102, the second imaging unit 103 (semiconductor inspection apparatus), the second calculation unit 104, the third calculation unit 105, the storage unit 106, and the determination unit 107 are connected to each other wirelessly or in a wired manner such that they can transmit information in both directions or one direction.

Figure 2A:
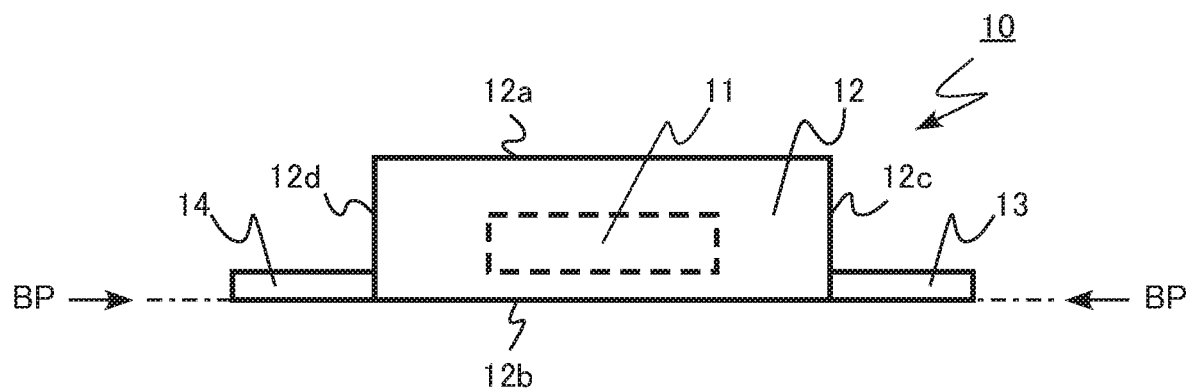
FIGS. 2A and 2B are diagrams schematically illustrating a semiconductor package to be inspected in the embodiment.
Figure 2B:
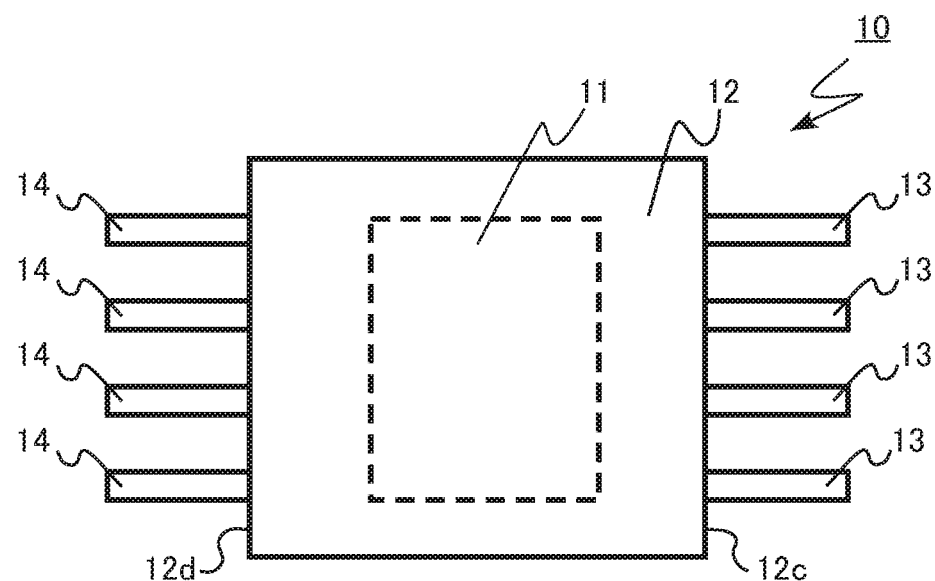

FIGS. 2A and 2B are diagrams schematically illustrating a semiconductor package which is an inspection target according to the embodiment. FIG. 2A is a side view and FIG. 2B is a top view.

A semiconductor package 10 includes a semiconductor chip 11, a sealing portion 12, a plurality of first leads 13, and a plurality of second loads 14.

The semiconductor chip 11 is, for example, a transistor or a diode using a semiconductor.

The sealing portion 12 has an upper surface 12a, a lower surface 12b, a first side surface 12c, and a second side surface 12d. The lower surface 12b is opposite to the upper surface 12a. The second side surface 12d is opposite to the first side surface 12c.

The sealing portion 12 seals the semiconductor chip 11. The sealing portion 12 surrounds the semiconductor chip 11. The sealing portion 12 is made of, for example, a resin. The sealing portion 12 is made of, for example, an epoxy resin.

The plurality of first leads 13 extend sideward from the first side surface 12c of the sealing portion 12. The plurality of second leads 14 extend sideward from the second side surface 12d of the sealing portion 12.

A plane that is parallel to the upper surface 12a and the lower surface 12b and passes through the lower ends of the first leads 13 and the second leads 14 which are close to the sealing portion 12 is defined as a reference plane BP.

Figure 3:
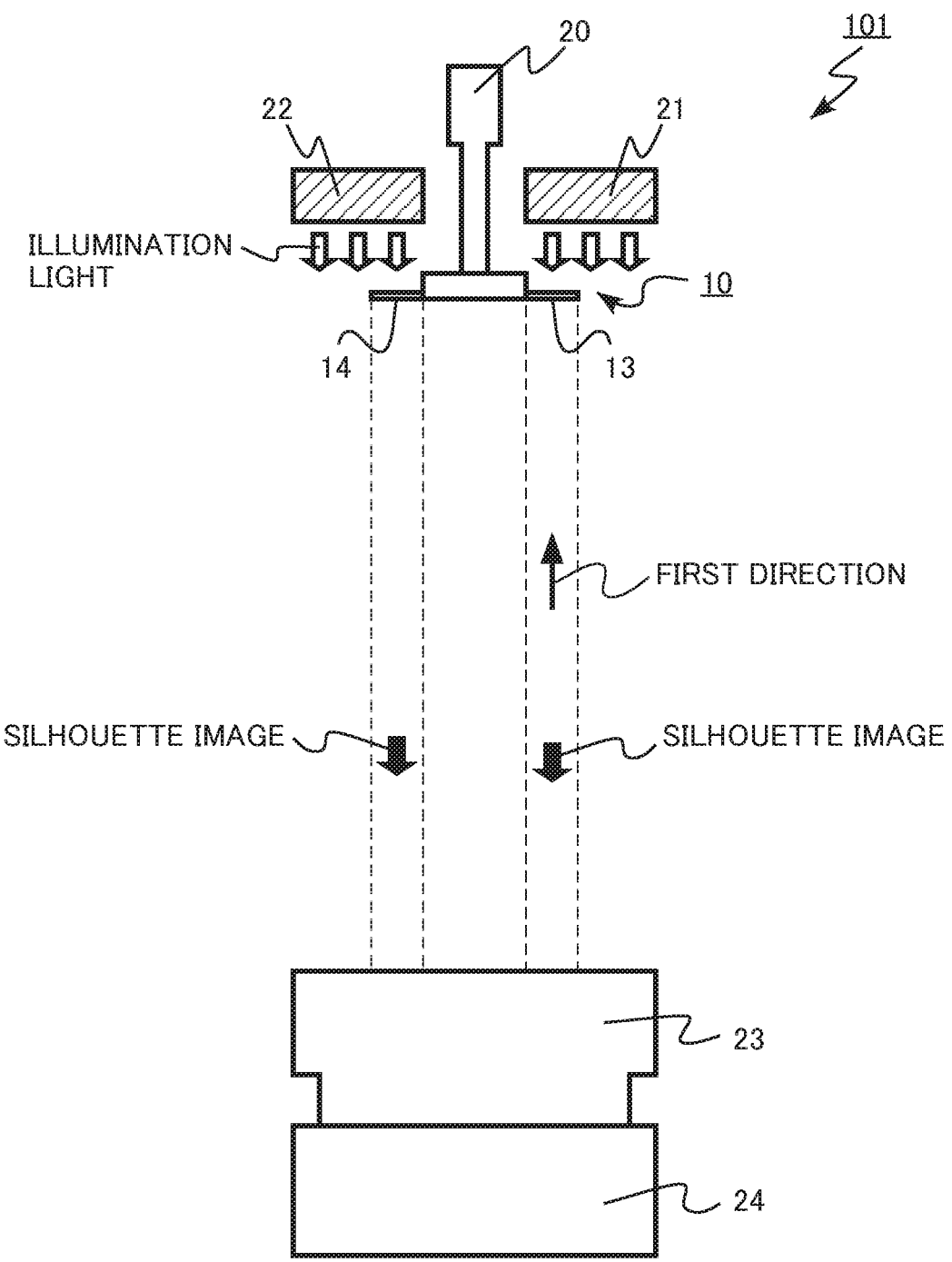
FIG. 3 is a diagram schematically illustrating a first imaging unit.

FIG. 3 is a diagram schematically illustrating the first imaging unit. The first imaging unit 101 includes a collet 20, a light source 21, a light, source 22, a lens 23, and a CCD camera 24.

The first imaging unit 101 captures the images of the first leads 13 in a direction perpendicular to the upper surface 12a and the lower surface 12b of the semiconductor package 10. The first direction is perpendicular to the reference plane BP. In FIG. 3, the upper surface 12a is an upper surface of the semiconductor package 10 and the lower surface 12b is a lower surface of the semiconductor package 10.

The collet 20 sucks and supports the semiconductor chip 11.

The light source 21 is provided on the side of the upper surface 12a and the first side surface 12c of the semiconductor package 10. In FIG. 3, the first side surface 12c is the right side surface of the semiconductor package 10. The light source 21 emits illumination light to the first leads 13.

The light source 22 is provided on the side of the upper surface 12a and the second side surface 12d of the semiconductor package 10. In FIG. 3, the second side surface 12d is the left side surface of the semiconductor package 10. The light source 22 emits illumination light to the second leads 14.

The light source 21 and the light source 22 are, for example, white light emitting diodes.

The lens 23 enlarges a silhouette image of the first leads 13 illuminated by the light source 21. In addition, the lens 23 enlarges a silhouette image of the second leads 14 illuminated by the light source 22.

The CCD camera 24 captures the silhouette image of the first leads 13 enlarged by the lens 23. In addition, the CCD camera 24 captures the silhouette image of the second leads 14 enlarged by the lens 23. The CCD camera 24 captures the silhouette image of the first leads 13 and the silhouette image of the second leads 14 at the same time.

Figure 4:
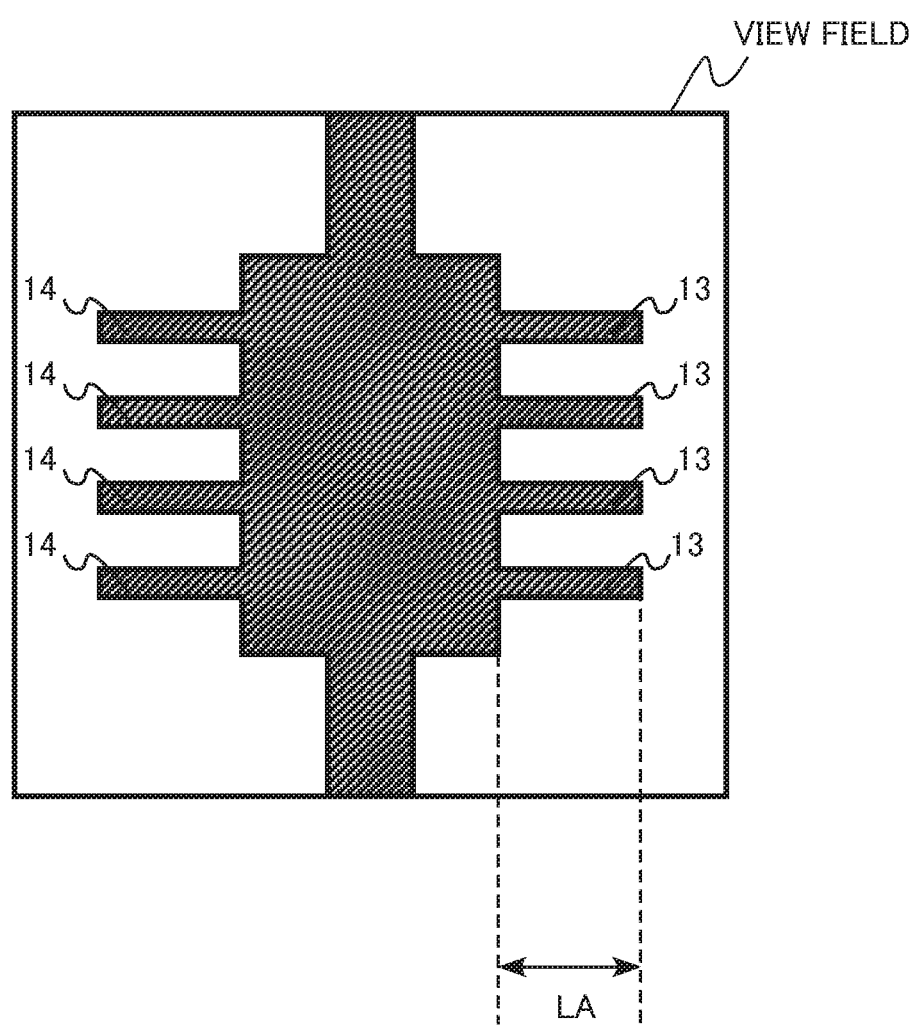
FIG. 4 is a diagram schematically illustrating an image captured by the first imaging unit.

FIG. 4 is a diagram schematically illustrating the image captured by the first imaging unit. The silhouette image of the first leads 13 and the silhouette image of the second leads 14 are captured by in the CCD camera 24 in the same view field.

The first calculation unit 102 calculates the front length (LA in FIG. 4) of the first lead 13 from the image captured by the first imaging unit 101. The first calculation unit 102 calculates the front length of the second lead 14 from the image captured by the first imaging unit 101, similarly to the case of the first lead 13. The first calculation unit 102 is configured by, for example, a combination of hardware and software.

Figure 5:
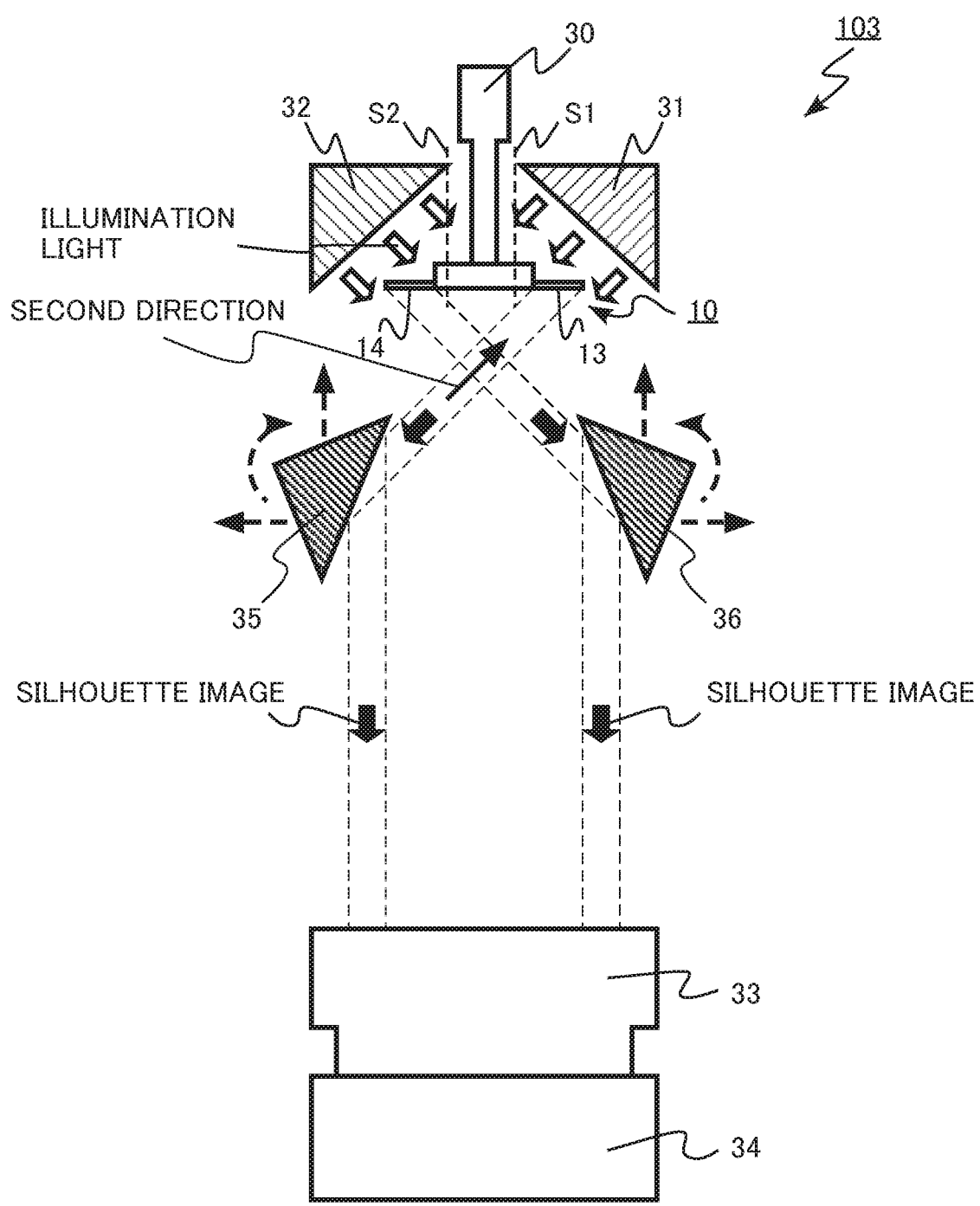
FIG. 5 is a diagram schematically illustrating a second imaging unit.

FIG. 5 is a diagram schematically illustrating the second imaging unit. The second imaging unit 103 includes a collet 30, a light source 31 (first light source), a light source 32 (second light source), a lens 33, a CCD camera 34 (camera), a first mirror 35, and a second mirror 36. The second imaging unit 103 is an example of the semiconductor inspection apparatus.

The second imaging unit 103 captures the image of the first leads 13 in a second direction which is inclined with respect to the upper surface 12a and the lower surface 12b of the semiconductor package 10. The second direction is inclined with respect to the reference plane BP. The second imaging unit 103 captures the image of the second leads 14 in the second direction which is inclined with respect to the upper surface 12a and the lower surface 12b of the semiconductor package 10, similarly to the case of the first leads 13. In FIG. 5, the upper surface 12a is the upper surface of the semiconductor package 10 and the lower surface 12b is lower surface of the semiconductor package 10.

The collet 30 sucks and supports the semiconductor chip 11.

The light source 31 is provided on the side of the upper surface 12a and the first side surface 12c of the semiconductor package 10. In FIG. 5, the first side surface 12c is the right side surface of the semiconductor package 10. The light source 31 emits illumination light to the first leads 13.

A perpendicular line (S1 in FIG. 5) drawn from an end of the light source 31 close to the semiconductor package 10 to the reference plane BP intersects, for example, the semiconductor package 10 or the first leads 13.

The light source 32 is provided on the side of the upper surface 12a and the second side surface 12d of the semiconductor package 10. In FIG. 5, the second side surface 12d is the left side surface of the semiconductor package 10. The light source 32 emits illumination light to the second leads 14.

A perpendicular line (S2 in FIG. 5) drawn from an end of the light source 32 close to the semiconductor package 10 to the reference plane BP intersects, for example, the semiconductor package 10 or the second leads 14.

For example, a distance between the light source 31 and the light source 32 is shorter than a distance from the outer end of the first lead 13 of the semiconductor package 10 to the outer end of the second lead 14. For example, the distance between the light source 31 and the light source 32 is less than the width of the sealing portion 12 of the semiconductor package 10.

The light source 31 and the light source 32 are, for example, white light emitting diodes.

Figure 6:
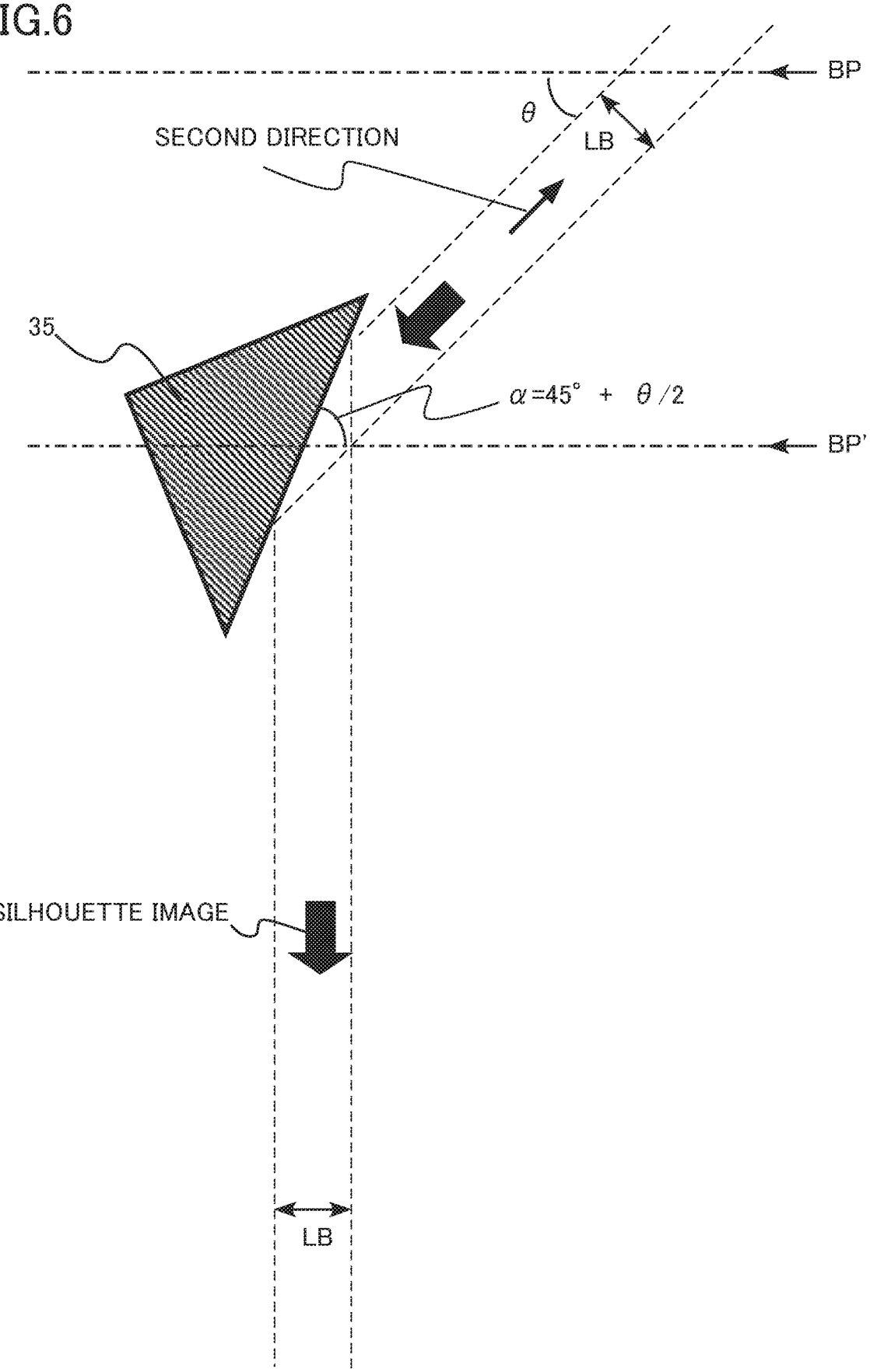
FIG. 6 is a diagram illustrating a first mirror.

FIG. 6 is a diagram illustrating the first mirror.

The first mirror 35 is provided on the side of the lower surface 12b and the second side surface 12d of the semiconductor package 10. The first mirror 35 reflects the silhouette image of the first leads 13 illuminated by the light source 31. The silhouette image of the first leads 13 reflected by the first mirror 35 travels in a direction perpendicular to the reference plane BP.

As described above, the second direction is inclined with respect to the reference plane BP. The angle formed between the reference plane BP and the second direction is represented by θ in FIG. 6. The angle θ formed between reference plane BP and the second direction is less than 90°. The angle of a surface of the first mirror 35 with respect to the reference plane BP, that is, an angle formed between a plane BP' illustrated in FIG. 6 and the surface of the first mirror 35 is represented by α in FIG. 6.

The angle θ formed between the reference plane BP and the second direction can be determined by adjusting the angle α of the surface of the first mirror 35 with respect to the reference plane BP. In a case in which the angle α is set to 45°+θ/2, the silhouette image of the first leads 13 reflected by the first mirror 35 travels in the direction perpendicular to the reference plane BP. For example, in a case in which θ is 20°, α may be 55°.

The angle θ formed between the reference plane BP and the second direction is, for example, equal to or greater than 10° and equal to or less than 60°. In this case, the angle α of the surface of the first mirror 35 with respect to the reference plane BP is equal to or greater than 50° and equal to or less than 75°.

The angle α of the first mirror 35 with respect to, for example, the reference plane BP is variable. For example, the first mirror 35 can be rotated as represented by α dotted arrow with an arc shape in FIG. 5. The first mirror 35 can be rotated by, for example, a rotating mechanism (not illustrated).

For example, the first mirror 35 can be moved in the vertical or horizontal direction as represented by α dotted arrow with a linear shape in FIG. 5. The first mirror 35 can be moved in the vertical or horizontal direction by, for example, a moving mechanism (not illustrated).

The second mirror 36 has the same configuration as the first mirror 35. The second mirror 36 is provided on the side of the lower surface 12b and the first side surface 12c of the semiconductor package 10. The second mirror 36 reflects the silhouette image of the second leads 14 illuminated by the light source 32. The silhouette image of the second leads 14 reflected by the second mirror 36 travels in the direction perpendicular to the reference plane BP.

For example, the angle of the second mirror 36 with respect to the reference plane BP is variable. The second mirror 36 can be rotated, for example, as represented by α dotted arrow with an arc shape in FIG. 5. The second mirror 36 can be rotated by, for example, a rotating mechanism (not illustrated).

For example, the second mirror 36 can be moved in the vertical or horizontal direction as represented by α dotted arrow with a linear shape in FIG. 5. The second mirror 36 can be moved in the vertical or horizontal direction by, for example, a moving mechanism (not illustrated).

The lens 33 enlarges the silhouette image of the first leads 13 illuminated by the light source 31. In addition, the lens 33 enlarges the silhouette image of the second leads 14 illuminated by the light source 32.

The CCD camera 34 captures the silhouette image of the first leads 13 enlarged by the lens 33. In addition, the CCD camera 34 captures the silhouette image of the second leads 14 enlarged by the lens 33. The CCD camera 34 captures the silhouette image of the first leads 13 and the silhouette image of the second leads 14 at the same time.

Figure 7:
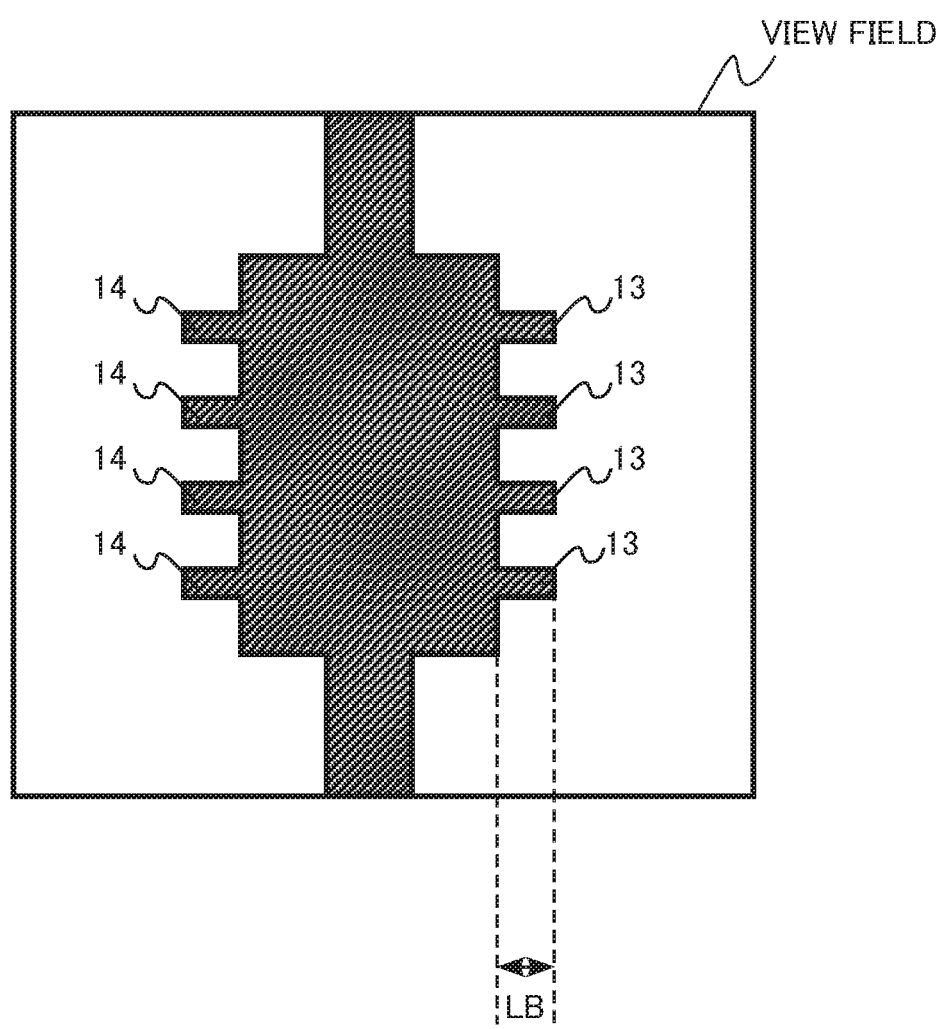
FIG. 7 is a diagram schematically illustrating an image captured by the second imaging unit.

FIG. 7 is a diagram schematically illustrating the image captured by the second imaging unit. The silhouette image of the first leads 13 and the silhouette image of the second leads 14 are captured by the CCD camera 34 in the same view field.

The second calculation unit 104 calculates the oblique length (LB in FIG. 7) of the first lead 13 from the image captured by the second imaging unit 103. The second calculation unit 104 calculates the oblique length of the second lead 14 from the image captured by the second imaging unit 103, similarly to the case of the first lead 13. The second calculation unit 104 is configured by, for example, a combination of hardware and software.

Figure 8:
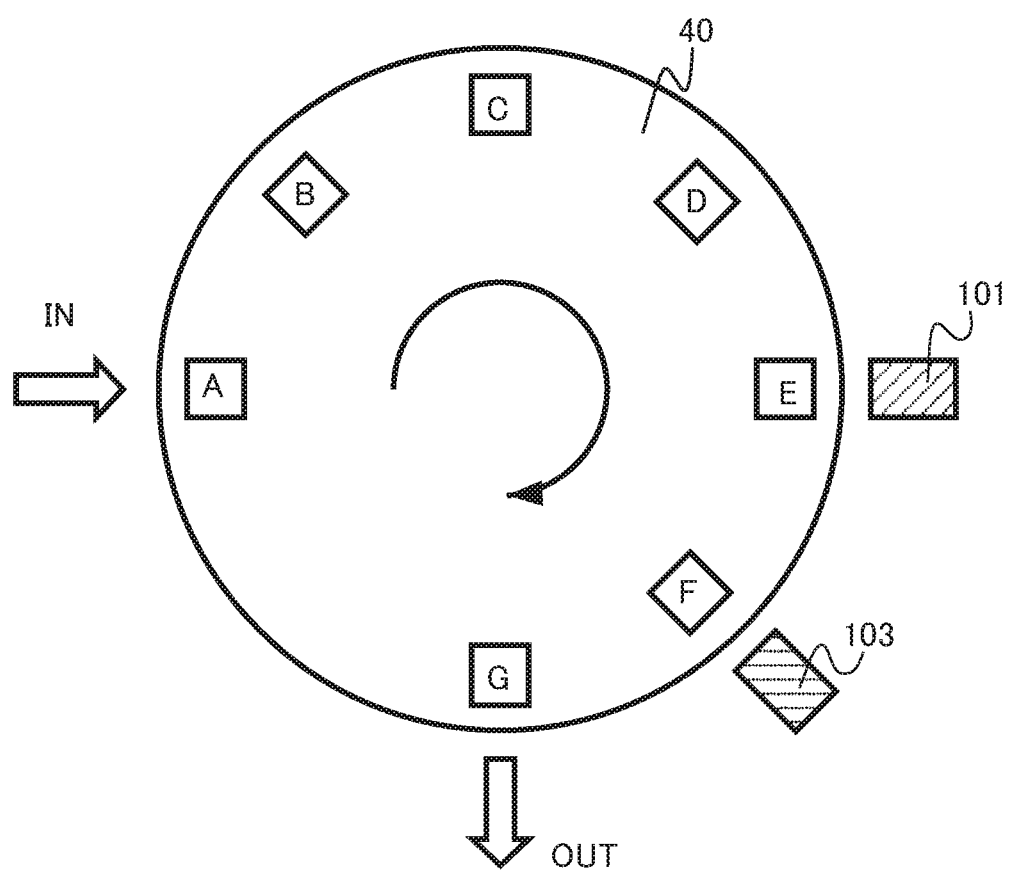
FIG. 8 is a conceptual diagram illustrating a portion of the semiconductor inspection system according to the embodiment.

FIG. 8 is a conceptual diagram illustrating a portion of the semiconductor inspection system according to the embodiment. The semiconductor inspection system 100 has, for example, an index table 40 illustrated in FIG. 8.

The index table 40 can be rotated in the direction represented by an arrow in FIG. 8. Positions A to G are provided on the index table 40.

The semiconductor package 10 to be inspected is mounted on the index table 40 at the position A and is separated from the index table 40 at the position G. For example, various electrical characteristics or appearances can be inspected at each of the positions A to G. For example, the first imaging unit 101 is provided at the position E and the second imaging unit 103 is provided at the position F.

The third calculation unit 105 calculates the amount of floating of the first lead 13 from the reference plane BP parallel to the upper surface 12a and the lower surface 12b, using the front length LA and the oblique length LB. Similarly, the third calculation unit 105 calculates the amount of floating of the second lead 14 from the reference plane BP parallel to the upper surface 12a and the lower surface 12b, using the front length and the oblique length. The third calculation unit 105 is configured by, for example, a combination of hardware and software.

Figure 9A:
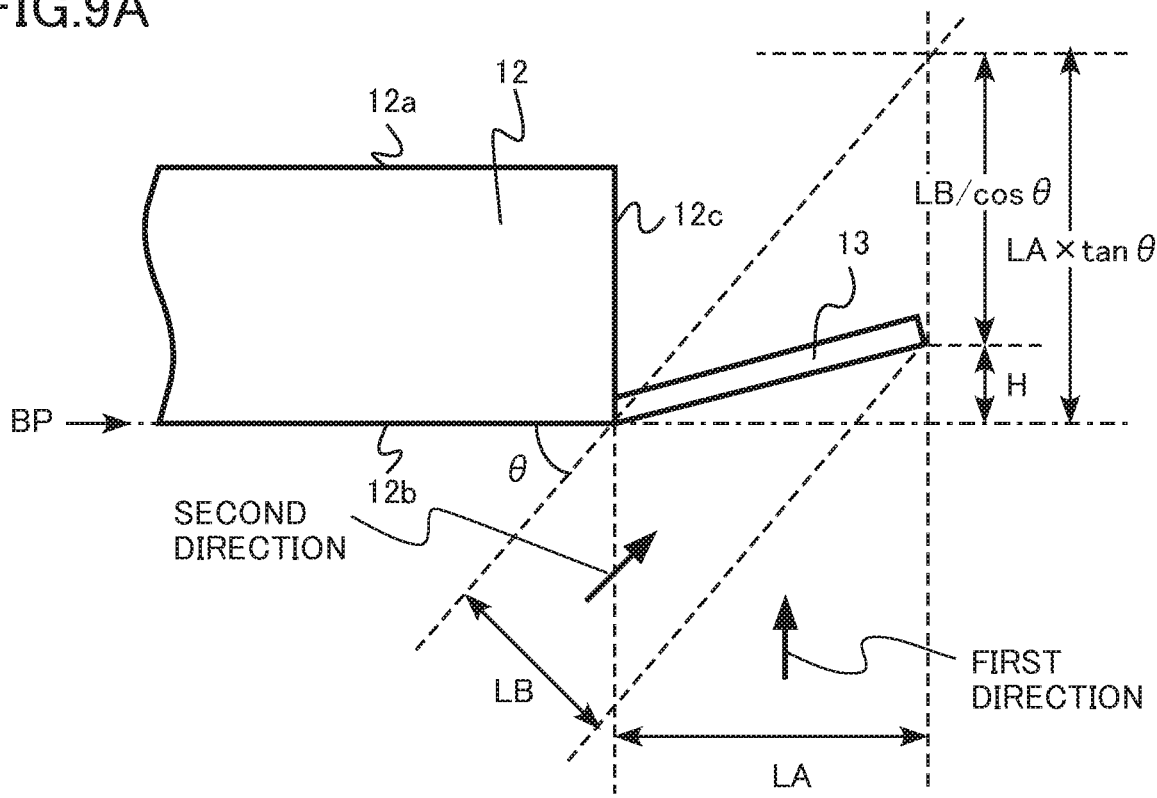
FIGS. 9A and 9B are diagrams illustrating the functions of a third calculation unit.
Figure 9B:
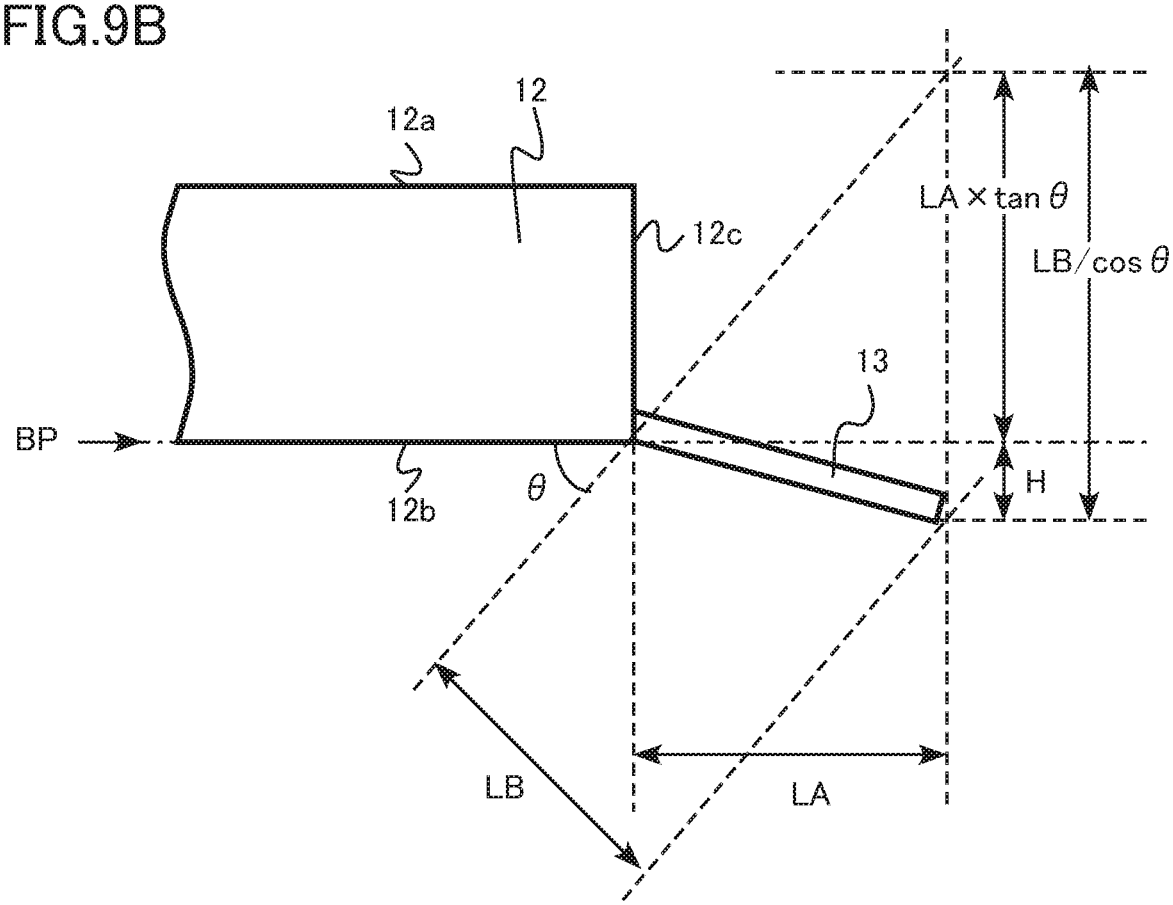

FIGS. 9A and 9B are diagrams illustrating the functions of the third calculation unit. FIG. 9A illustrates a case in which the first lead 13 floats upward from the original position. FIG. 9B illustrates a case in which the first lead 13 is sunk downward from the original position.

In a case in which the angle formed between the reference plane BP and the second direction is θ, a front length is LA, an oblique length is LB, and the amount of floating is H, the third calculation unit 105 calculates the amount of floating H using the following expression:

$$H = LA \times \tan\theta - LB/\cos\theta \qquad \text{(Expression)}$$

The amount of floating H calculated by the above-mentioned expression is a positive value in a case in which the first lead 13 floats upward from the original position as illustrated in FIG. 9A. In contrast, the amount of floating H is a negative value in a case in which the first lead 13 is sunk downward from the original position as illustrated in FIG. 9B.

The third calculation unit 105 also calculates the amount of floating of the second lead 14 using the above-mentioned expression.

The storage unit 106 stores a threshold value of the amount of floating. The threshold value of the amount of floating is, for example, the upper limit of the amount of floating at which the semiconductor package 10 is determined to be good. The storage unit 106 is, for example, a semiconductor memory.

The determination unit 107 compares the amount of floating with the threshold value stored in the storage unit 106 to determine whether the semiconductor package 10 is defective. For example, in a case in which the amount of floating is greater than the threshold value stored in the storage unit 106, the semiconductor package 10 is determined to be defective.

The determination unit 107 is configured by, for example, a combination of hardware and software.

Next, the function and effect of the semiconductor inspection system and the semiconductor inspection apparatus according to the embodiment will be described.

In a case in which the lead of the semiconductor package floats from the original position, there is a problem that a connection failure occurs when the semiconductor package is mounted on, for example, a printed circuit board. Therefore, an inspection system for accurately measuring the amount of floating of the lead is required in the appearance inspection of the semiconductor package.

Figure 10A:
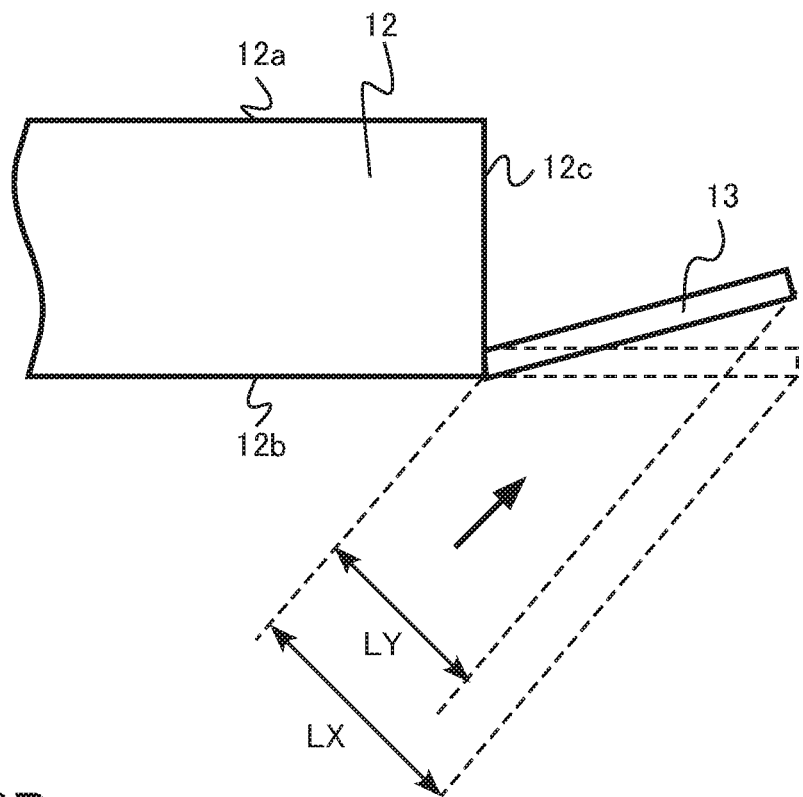
FIGS. 10A and 10B are diagrams illustrating problems in the appearance inspection of a semiconductor package.
Figure 10B:
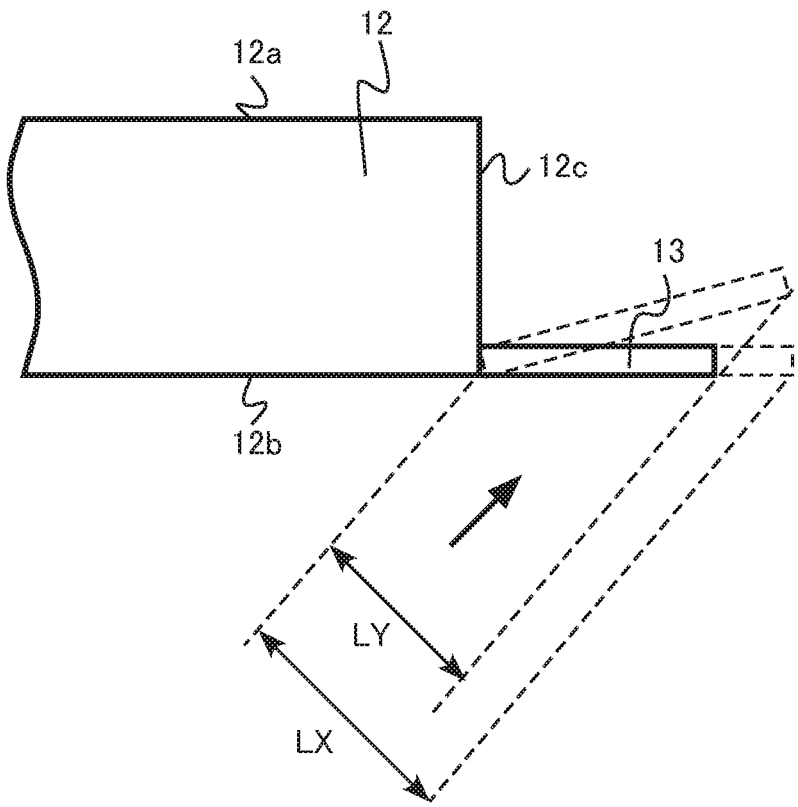

FIGS. 10A and 10B are diagrams illustrating problems in the appearance inspection of the semiconductor package. FIG. 10A illustrates a case in which the first lead 13 floats upward from the original position. FIG. 10B illustrates a case in which the length of the first lead 13 is less than the original length.

There is an appearance inspection method which captures the image of the first leads 13 in a direction (arrows in FIGS. 10A and 10B) inclined with respect to the upper surface 12a and the lower surface 12b of the semiconductor package 10 and determines the floating of the first leads 13 on the basis of the acquired image. In this inspection method, for example, as illustrated in FIG. 10A, in a case in which an oblique length (LY in FIGS. 10A and 10B) as seen from the oblique direction is less than the originally assumed oblique length (LX in FIGS. 10A and 10B), it is determined that the first lead 13 floats. In addition, for example, in a case in which the oblique length LY is less than the oblique length of other adjacent first leads 13, it is determined that the first lead 13 floats.

However, as illustrated in FIG. 10B, even in a case in which the first lead 13 does not float and the length of the first lead 13 is simply less than the original length, the oblique length LY is less than the originally assumed oblique length LX. Therefore, in a case in which the amount of floating of the first lead 13 is determined by only the measurement of the oblique length, it is difficult to exclude a case in which the first lead 13 is short. As a result, there is a concern that an error in determination will occur.

The semiconductor inspection system according to the embodiment calculates the amount of floating H of the first lead 13, using both the front length LA and the oblique length LB, as illustrated in FIGS. 9A and 9B. Therefore, it is possible to calculate the amount of floating H considering a change in the length of the first lead 13. Thus, it is not determined that the first lead 13 is floating on the basis of only the length of the first lead 13 less than the original length and it is possible to avoid an error in determination. As a result, it is possible to accurately measure the amount of floating H of the first lead 13.

Preferably, the storage unit 106 of the semiconductor inspection system according to the embodiment further stores a threshold value of the front length LA and the determination unit 107 compares the front length LA with the threshold value of the front length LA and determines whether the semiconductor package 10 is defective. The threshold value of the front length LA is, for example, the lower limit or upper limit of the front length LA.

In a case in which there is a first lead 13 with a very small length, the provision of the lower limit of the front length LA makes it possible to exclude the first lead 13 as a defect. In addition, in a case in which the amount of floating of the first lead 13 is very large, the provision of the lower limit of the front length LA makes it possible to exclude the first lead 13 as a defect.

In addition, in a case in which there is a first lead 13 with a very large length, the provision of the upper limit of the front length LA makes it possible to exclude the first lead 13 as a defect.

The second imaging unit 103 (semiconductor inspection apparatus) according to the embodiment includes the light source 31 (first light source), the light source 32 (second light source), the lens 33, the CCD camera 34, the first mirror 35, and the second mirror 36.

In the second imaging unit 103, the light source 31 and the light source 32 are provided on the side of the upper surface 12a of the semiconductor package 10, that is, on the side facing the CCD camera 34 with the semiconductor package 10 interposed therebetween. With this configuration, the light source 31 and the light source 32 can function as a backlight and the CCD camera 34 can capture the silhouette image of the first leads 13 and the silhouette image of the second leads 14.

In a case in which the length of the first leads 13 and the second leads 14 is measured using a specular reflection image, the accuracy of measurement is reduced by the influence of scattered reflection. The second imaging unit 103 measures the length of the first leads 13 and the second leads 14 using the silhouette images. Therefore, the influence of scattered reflection is excluded and the accuracy of measuring the length of the first leads 13 and the second leads 14 is improved.

The second imaging unit 103 is provided with two mirrors and can capture the silhouette image of the first leads 13 and the silhouette image of the second leads 14 at the same time using the CCD camera 34. Therefore, the time required for appearance inspection is reduced and the throughput of the appearance inspection is improved.

In addition, the second imaging unit 103 captures the enlarged silhouette image of the first leads 13 and the enlarged silhouette image of the second leads 14 using the lens 33. Therefore, the accuracy of measuring the length of the first leads 13 and the second leads 14 is improved.

In the second imaging unit 103, for example, the angle θ formed between the reference plane BP and the second direction is preferably equal to or greater than 10° and equal to or less than 60° and more preferably equal to or greater than 15° and equal to or less than 50°. In a case in which the angle θ falls within the above-mentioned range, the accuracy of measuring the oblique length is improved. Therefore, the accuracy of measuring the amount of floating is improved.

It is preferable that the second imaging unit 103 includes a mechanism for rotating the first mirror 35 and the angle α of the first mirror 35 with respect to the reference plane BP is variable. In addition, preferably, the second imaging unit 103 includes a mechanism for moving the first mirror 35 and the first mirror 35 can be moved in the vertical or horizontal direction. The provision of the rotating mechanism or the moving mechanism makes it easy to perform adjustment for increasing the accuracy of measuring the amount of floating of the first lead 13. Further, the provision of the rotating mechanism or the moving mechanism makes it easy to perform adjustment, for example, in a case in which the type of the semiconductor package 10 is changed.

It is preferable that the second imaging unit 103 includes a mechanism for rotating or moving the second mirror 36, similarly to the first mirror 35.

In the second imaging unit 103, it is preferable that a perpendicular line (S1 in FIG. 5) drawn from an end of the light source 31 close to the semiconductor package 10 to the reference plane BP intersects, for example, the semiconductor package 10 or the first leads 13. It is easy for the light source 31 to illuminate the entire region of the first leads 13. In addition, it is preferable that a perpendicular line (S2 in FIG. 5) drawn from an end of the light source 32 close to the semiconductor package 10 to the reference plane BP intersects, for example, the semiconductor package 10 or the second leads 14. It is easy for the light source 32 to illuminate the entire region of the second leads 14.

As described above, according to the embodiment, it is possible achieve a semiconductor inspection system and a semiconductor inspection apparatus that can accurately measure the amount of floating of leads.

In the embodiment, the configuration in which the first imaging unit 101 captures a silhouette image using a backlight has been described as an example. However, the first imaging unit 101 may capture a specular reflection image.

While certain embodiments have been described, these embodiments have been presented by way of example only, and are not intended to limit the scope of the inventions. Indeed, the semiconductor inspection system and the semiconductor inspection apparatus described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor inspection system comprising:
   a rotatable index table configured to mount a semiconductor package to be inspected, the semiconductor package including a sealing portion and a first lead, the sealing portion sealing a semiconductor chip, the sealing portion having an upper surface, a lower surface, a first side surface, and a second side surface opposite to the first side surface, the first lead extending sideward from the first side surface of the sealing portion;
   a first camera configured to capture an image of the first lead of the semiconductor package from a first direction perpendicular to the upper surface and the lower surface, the first camera disposed at a first position along a perimeter of the index table;
   a first calculator configured to calculate a front length of the first lead from the image captured by the first camera;
   a mirror;
   a second camera capturing an image of the first lead from a second direction inclined with respect to the upper surface and the lower surface using the mirror, the second camera disposed at a second position along a perimeter of the index table different from the first position;
   a second calculator calculating an oblique length of the first lead from the image captured by the second camera; and
   a third calculator calculating an amount of floating of the first lead from a reference plane parallel to the upper surface and the lower surface, using the front length and the oblique length.

2. The semiconductor inspection system according to claim 1,
   wherein the third calculator is configured to calculate the amount of floating using the following expression in a case in which an angle formed between the reference plane and the second direction is θ, the front length is LA, the oblique length is LB, and the amount of floating is H:

$$H = LA \times \tan\theta - LB/\cos\theta \quad \text{(Expression)}$$

3. The semiconductor inspection system according to claim 1, further comprising:
   a storage storing a threshold value of the amount of floating; and
   a determination hardware comparing the amount of floating with the threshold value of the amount of floating and determining whether the semiconductor package is defective.

4. The semiconductor inspection system according to claim 1, further comprising:
   a collet sucking and supporting the semiconductor package.

5. A semiconductor inspection system comprising:
   a first camera configured to capture an image of a first lead and a second lead of a semiconductor package from a first direction perpendicular to an upper surface and a lower surface at a same time, the semiconductor package including a sealing portion, the first lead, and the second lead, the sealing portion sealing a semiconductor chip, the sealing portion having the upper surface, the lower surface, a first side surface, and a second side surface opposite to the first side surface, the first lead extending sideward from the first side surface of the sealing portion, and the second lead extending sideward from the second side surface;
   a first calculator calculating a front length of the first lead and the second lead from the image captured by the first camera;
   a first light source provided on an upper surface side and a first side surface side of the semiconductor package;
   a second light source provided on the upper surface side and a second side surface side of the semiconductor package;
   a first mirror provided on a lower surface side and the second side surface side of the semiconductor package and configured to reflect a silhouette image of the first lead illuminated by the first light source;
   a second mirror provided on the lower surface side and the first side surface side of the semiconductor package and configured to reflect a silhouette image of the second lead illuminated by the second light source;
   a second camera provided on the lower surface side of the semiconductor package, the second camera configured to capture the silhouette image of the first lead from a second direction inclined with respect to the upper surface and the lower surface, the second camera configured to capture the silhouette image of the second lead from a third direction inclined with respect to the upper surface and the lower surface, the second camera configured to capture the silhouette image of the first lead and the silhouette image of the second lead at the same time;
   a second calculator configured to calculate an oblique length of the first lead and the second lead from the image captured by the second camera; and
   a third calculator configured to calculate an amount of floating of the first lead and the second lead from a reference plane parallel to the upper surface and the lower surface, using the front length and the oblique length,
   wherein a perpendicular line drawn from an end of the first light source close to the semiconductor package to the reference plane intersects the semiconductor package or the first lead, and
   a perpendicular line drawn from an end of the second light source close to the semiconductor package to the reference plane intersects the semiconductor package or the second lead.

6. The semiconductor inspection system according to claim 5,
   wherein an angle of the first mirror with respect to the reference plane is variable, and
   an angle of the second mirror with respect to the reference plane is variable.

7. A semiconductor inspection system comprising:
a first camera capturing an image of a first lead of a semiconductor package from a first direction perpendicular to an upper surface and a lower surface, the semiconductor package including a sealing portion and the first lead, the sealing portion sealing a semiconductor chip, the sealing portion having the upper surface, the lower surface, a first side surface, and a second side surface opposite to the first side surface, the first lead extending sideward from the first side surface of the sealing portion;
a first calculator configured to calculate a front length of the first lead from the image captured by the first camera
a second camera configured to capture an image of the first lead from a second direction inclined with respect to the upper surface and the lower surface;
a second calculator configured to calculate an oblique length of the first lead from the image captured by the second camera; and
a third calculator configured to calculate an amount of floating of the first lead from a reference plane parallel to the upper surface and the lower surface, using the front length and the oblique length,
wherein the third calculator configured to calculate the amount of floating using the following expression in a case in which an angle formed between the reference plane and the second direction is $\theta$, the front length is LA, the oblique length is LB, and the amount of floating is H:

$$H = LA \times \tan\theta - LB/\cos\theta \qquad \text{(Expression)}.$$

\* \* \* \* \*